United States Patent [19]

Rothrock

[11] 4,025,386
[45] May 24, 1977

[54] METHOD FOR PRODUCING R-PLANE SINGLE CRYSTAL ALPHA ALUMINA IN MASSIVE FORM HAVING SUBSTANTIALLY CIRCULAR CROSS-SECTION

[75] Inventor: Larry R. Rothrock, Poway, Calif.

[73] Assignee: Union Carbide Corporation, New York, N.Y.

[22] Filed: June 28, 1976

[21] Appl. No.: 700,588

Related U.S. Application Data

[63] Continuation of Ser. No. 535,093, Dec. 20, 1974, abandoned.

[52] U.S. Cl. .................. 156/617 SP; 23/205 A; 156/DIG. 61; 156/DIG. 65; 23/273 SP
[51] Int. Cl.² .................. B01J 17/18; C01F 7/02
[58] Field of Search .............. 156/DIG. 61, 617 SP, 156/DIG. 65; 23/305 A, 273 SP

[56] References Cited

UNITED STATES PATENTS

| 3,527,574 | 9/1970 | Belle | 156/DIG. 61 |
| 3,621,213 | 11/1971 | Jen | 156/617 SP |
| 3,650,703 | 3/1972 | Labelle | 156/DIG. 61 |
| 3,655,415 | 4/1972 | Keig | 156/DIG. 61 |
| 3,715,194 | 2/1973 | Plooster | 156/DIG. 61 |
| 3,761,692 | 9/1973 | Cope | 156/617 SP |

FOREIGN PATENTS OR APPLICATIONS

935,390   8/1963   United Kingdom ........ 156/DIG. 61

OTHER PUBLICATIONS

Namamoto et al., Sci. Rep. of Res. Insti–Tohoku Univ A, Japan, vol. 22, No. 4, Feb. 1971, pp. 156–164.
Kronberg, Acta Mettallurgica, vol. 5, 1957, Plastic Reformation of Sapphire, pp. 508–524.
Sahagian et al., Conf. Growth of Crystals, Moscow, USSR, 20–21, July 1966, Crystal Perfection of α-Al$_2$O$_3$A$_2$A Function of Growth Method, pp. 183–194.
Runyan, The Rev. of Sci–Instru, vol. 30, No. 7, July, 1959, pp. 535–540.

*Primary Examiner*—Stephen J. Emery
*Attorney, Agent, or Firm*—Frederick J. McCarthy, Jr.

[57] ABSTRACT

Method for producing massive unicrystalline R-plane alpha alumina of circular cross-section from an alumina melt by controlled rotation of the seed rod upon which the alpha alumina is solidified and crystallized.

1 Claim, 14 Drawing Figures

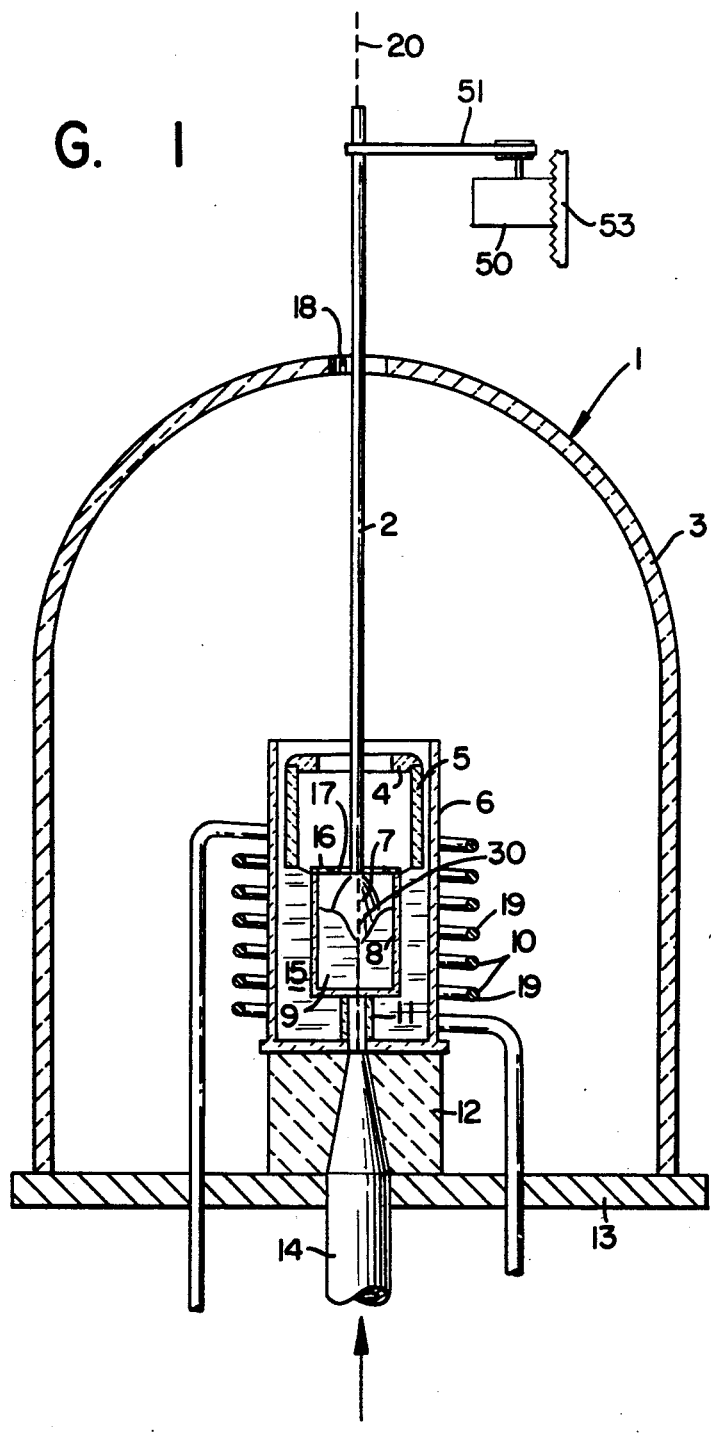
F I G. 1

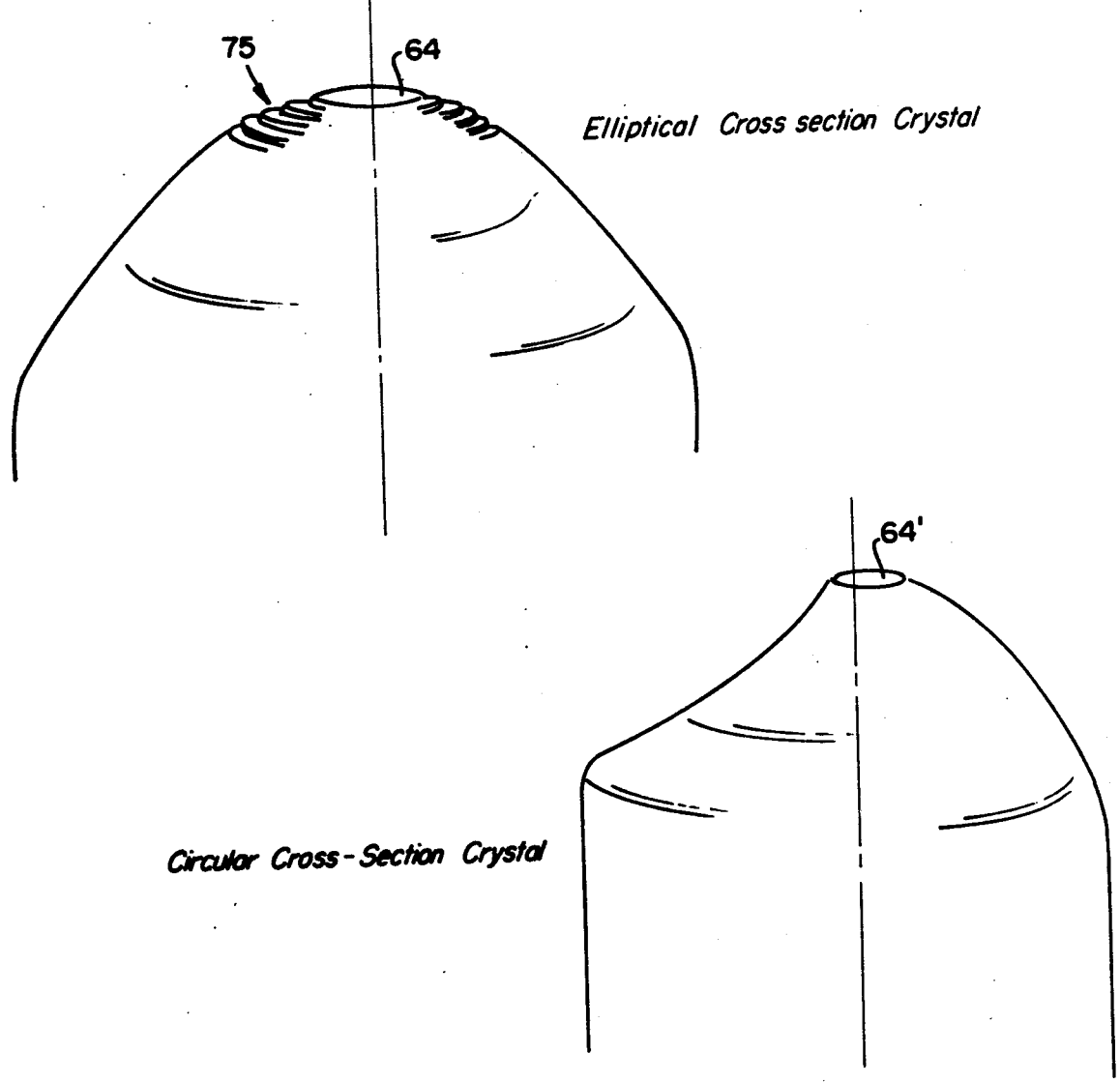
FIG. 5
Elliptical Cross section Crystal
Circular Cross-Section Crystal
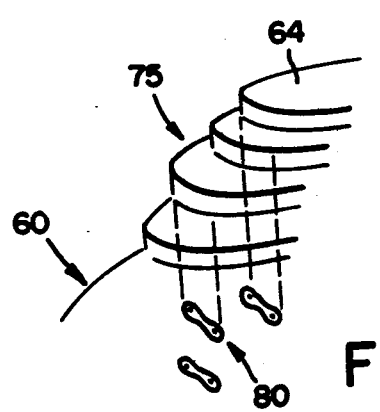
FIG. 5a
FIG. 6

METHOD FOR PRODUCING R-PLANE SINGLE CRYSTAL ALPHA ALUMINA IN MASSIVE FORM HAVING SUBSTANTIALLY CIRCULAR CROSS-SECTION

This is a continuation of U.S. application Ser. No. 535,093, filed Dec. 20, 1974, now abandoned.

The present invention relates to a method for producing unicrystalline alpha alumina material. More particularly the present invention is directed to a method for producing unicrystalline alpha alumina material having an R-plane orientation.

A process for producing unicrystalline alpha alumina material in massive form by pulling a seed rod from a melt is disclosed in U.S. Pat. No. 3,715,194 — Plooster and the present invention is an improvement of the method disclosed therein, the disclosure of U.S. Pat. No. 3,715,194 being incorporated herein by reference.

The process disclosed in the above-noted patent is successfully employed in the production of massive unicrystalline alpha alumina material which was used for a wide variety of applications such as optical windows, bearings, wear plates, cutters and the like.

It has recently been of interest to provide R-plane unicrystalline alpha alumina material for such uses as passive substrates for electronic circuits since R-plane unicrystalline alpha alumina provides significant well known advantages compared to other crystal orientations.

An R-plane unicrystalline alpha alumina material, as is known to the art, is at a C-axis orientation of 57½° having one of its R-planes normal to its growth axis.

In producing such R-plane unicrystalline alpha alumin material from water white alumina by the method of the above-mentioned U.S. patent, it has been found that the massive unicrystalline material produced did not form as a mass of substantially circular cross-section as was the usual case with other crystal orientations, but instead consistently formed with a highly elliptical cross-section. The major axis of which lies in the plane defined by the C-axis of the crystal and the longitudinall axis of the crystal. Such a shape is inefficient in view of the industrial demand for circular substrates, considerable wastage of material necessarily resulting in forming circular cross-section from an elliptical mass.

It is, therefore, an object of the present invention to provide a method for producing massive unicrystalline R-plane alpha alumina shapes having a substantially circular cross-section.

Other objects will be apparent from the following description and claims taken in conjunction with the drawing in which:

FIG. 1 shows an apparatus suitable for practice of the present invention;

FIG. 1(a) ilustrates the orientation of the seed rod used in the apparatus of FIG. 1;

Figure 3:
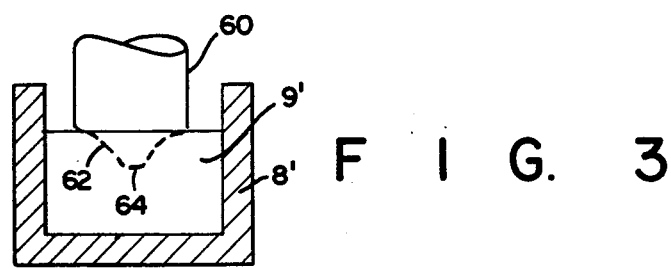
FIG. 3 is a schematic illustration of an alpha alumina crystal being pulled from a melt.
Figure 3A:
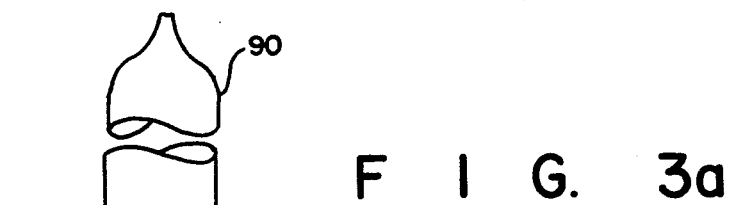
FIG. 3(a) is a schematic illustration in elevation of an R plane single crystal.
Figure 3B:
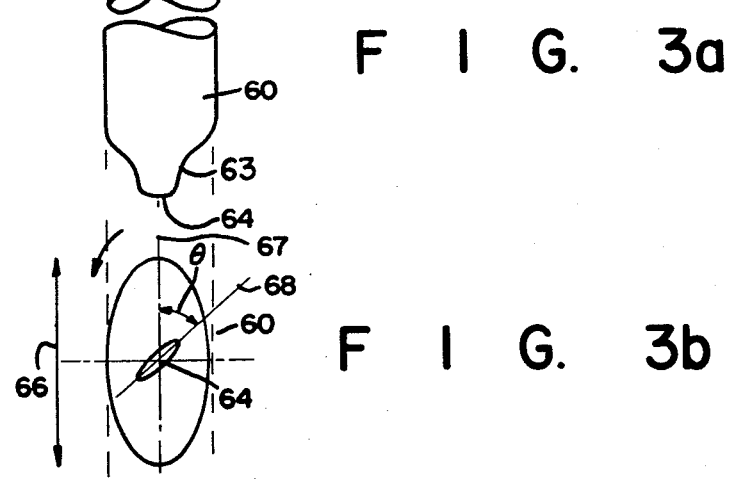
Figure 3C:
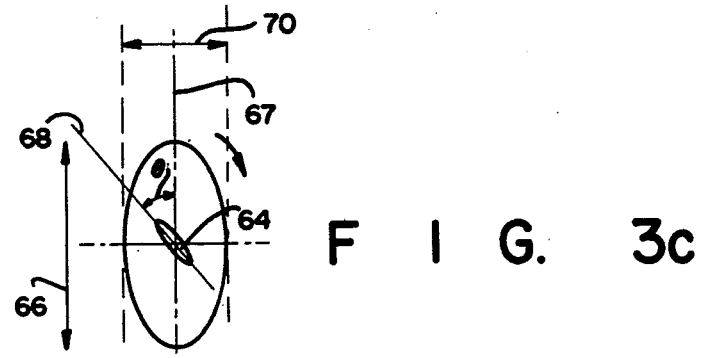
Figure 3D:
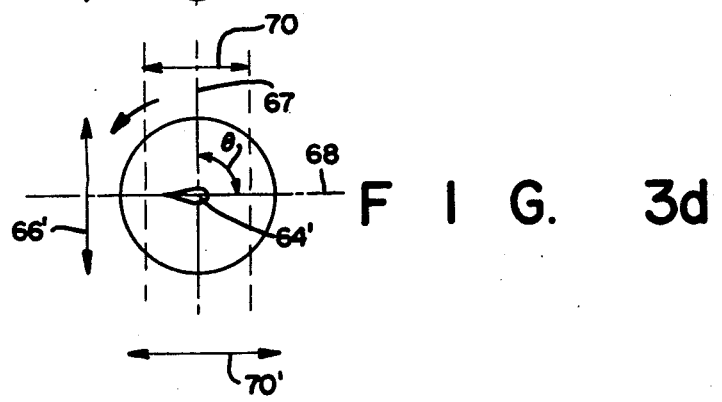
Figure 4:
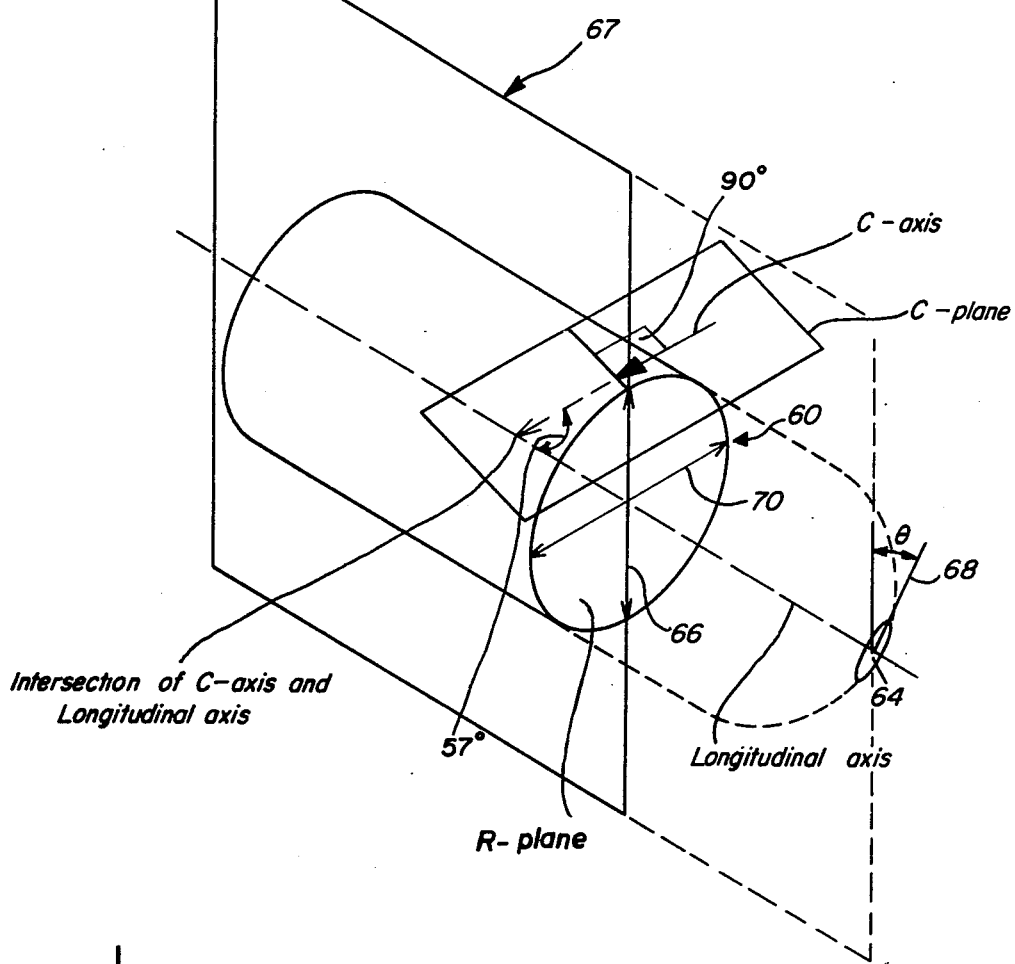
Figure 7:
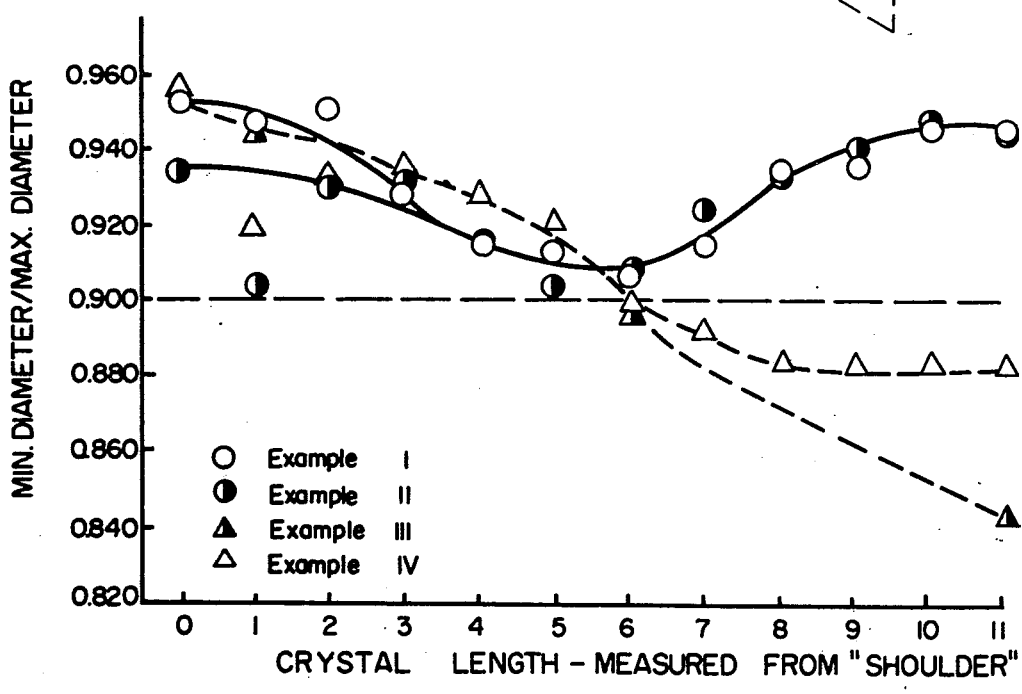

FIGS. 3(b), 3(c) and 3(d) illustrate the cross-section of the crystal of FIG. 3(a) for different rotation speeds of the seed crystal during the pulling of the crystal;

FIG. 4 is an isometric view of a portion of a crystal as illustrated in FIG. 3(a) showing various planes and axes of interest in the practice of the present invention;

FIGS. 5 and 5(a) illustrate schematically an elliptical cross-section R-plane single crystal of alpha alumina having the step-like facets common to crystals of such cross-section;

FIG. 6 illustrates schematically a circular cross-section R-plane single crystal of alpha alumina produced in accordance with the present invention illustrating the absence of step-like facets in such circular cross-section crystals;

FIG. 7 shows a graph for the cross-section measurements of the R-plane single crystals of the specific examples of the specification.

The method of the present invention for producing R-plane unicrystalline alpha alumina involves the following steps:

i. forming a melt of alumina by heating the same to form a melt at a temperature of at least 2040° C, ii. inserting a seed rod of unicrystalline alpha alumina into the melt, said seed rod having an orientation such that its longitudinal axis is normal to an R-plane of said rod, iii. maintaining an atmosphere over the melt which is substantially chemically inert to the melt, and iv. withdrawing the seed rod from the melt, and rotating the seed rod about its longitudinal axis at a relatively fast rate, such that alumina material is solidified and crystallized on the seed rod to form a massive unicrystalline circular cross-section having a growth axis common with the longitudinal axis of the seed rod. The massive unicrystalline product, upon withdrawal from the melt, is characterized by an end portion of elongate cross-section, the longest axis of which is substantially perpendicular, e.g. 90° ± 15° to the plane defined by the C-axis of the crystal and the longitudinal axis of the crystal.

The improvement of the present invention with respect to the method of the above-mentioned U.S. Pat. No. 3,715,194 resides in the employment of a controlled rotation rate of the seed rod during solidification and crystallization of alumina material on the seed rod. By controlling the rotation rate of the seed rod, a massive R-plane unicrystalline material of constant circular cross-section is readily obtained, e.g. the largest diameter of the crystal is not more than about 10% larger than the shortest diameter. Also, it has been found that fast crystal growth rates can be achieved without detrimentally affecting the quality of the unicrystalline material.

With reference to FIG. 1, which corresponds to FIG. 1 of the above-noted U.S. Pat. No. 3,715,194, there is illustrated a crystal growth chamber 1. Alumina melt 9 is contained in a crucible 8 which is preferably fabricated from iridium. A washer 16, preferably iridium, having a central aperture 17 rests on top the crucible 8 and acts as a radiation shield to reduce heat loss from the melt 9. The crucible 8 is bounded on its sides and bottom with insulation 15. The insulation is preferably zirconia and serves to: reduce the power required to sustain the melt 9; reduce thermal gradients along the crucible; and to dampen temperature fluctuations arising from line voltage fluctuations, convective cooling effects from the atmosphere, as well as other disturbances. Hollow tubing 11 forms an aperture through which the temperature of the bottom of the crucible 8 can be determined by, for example, a radiation pyrometer focused on the center of the bottom of the crucible.

A ceramic washer 4, fabricated from alumina for example, is supported by tubing 5 preferably of zirconia. The washer 4 serves as a secondary radiation shield and to restrict the convective currents of the atmosphere against entering the top of the crucible and reaching the growing crystal 7. Thus, it serves to reduce the vertical temperature gradients in the vicinity of the growing crystal and to augment the effects of the washer 16.

Sleeve 6, formed of silicon dioxide, for example, serves to contain the insulation 15 and serves as a part of the insulating assembly surrounding the crucible 8. The tubing 5 which serves to support the washer 4 also functions as a part of the insulating system.

Figure 1A:
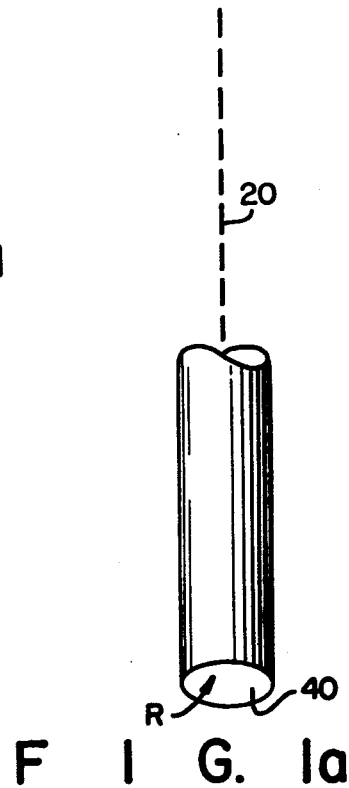

The crucible 8 and its surrounding insulating assembly rests on a ceramic pedestal 12 composed of, for example, zirconium oxide ($ZrO_2$). The entire assembly is enclosed in a bell jar 3 sealed to a base plate 13. The base plate 13 is composed of any suitable material such as for example silicone-bonded fiber glass. The desired gas atmosphere for the inside of the crucible 8, i.e. a gas atmosphere non-reactive with the melt in the crucible, e.g. nitrogen, noble gases, is introduced into sight tube 14 which communicates with tubing 11. The gas exits through the hole 18 in the bell jar 3 through which the seed rod 2 is inserted. Seed rod 2 is in the form of unicrystalline alpha alumina material having its longitudinal axis 20 common with the growth axis 30 of crystal 7 and the unicrystalline material of seed rod 2 is such that an R-plane 40 thereof is normal to the longitudinal axis 20 as shown in FIG. 1(a). Such a seed rod can be routinely prepared and results in the production of a massive unicrystalline material of R-plane orientation. A drive motor 50 is coupled to seed rod 2 via belt 51 and causes seed rod 2 to rotate while the seed 2 is being pulled from the alumina melt 9 following procedures known to the art as exemplified by U.S. Pat. No. 3,715,194. In FIG. 1 drive motor 50 is shown schematically engaged to a racket arrangement 53 which reaises motor 50 and seed rod 2 to pull seed rod 2 from the melt.

Figure 2A:
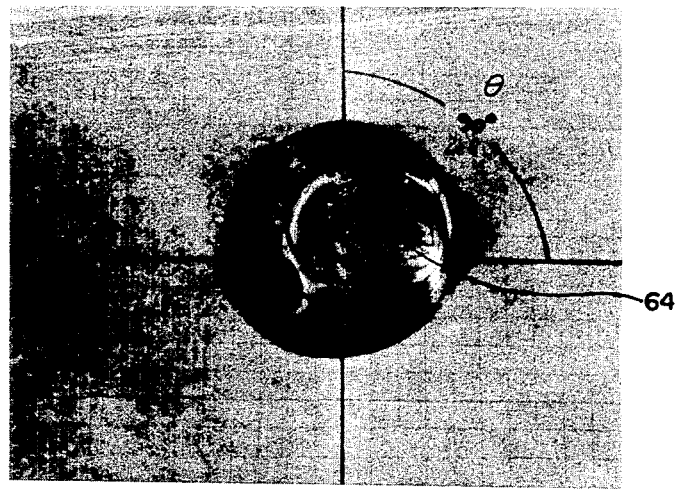
FIG. 2(a) is an actual size photograph of an R plane alpha alumina single crystal produced in accordance with the present invention showing the circular cross-section of the crystal and the last formed portion of the crystal.
Figure 2B:
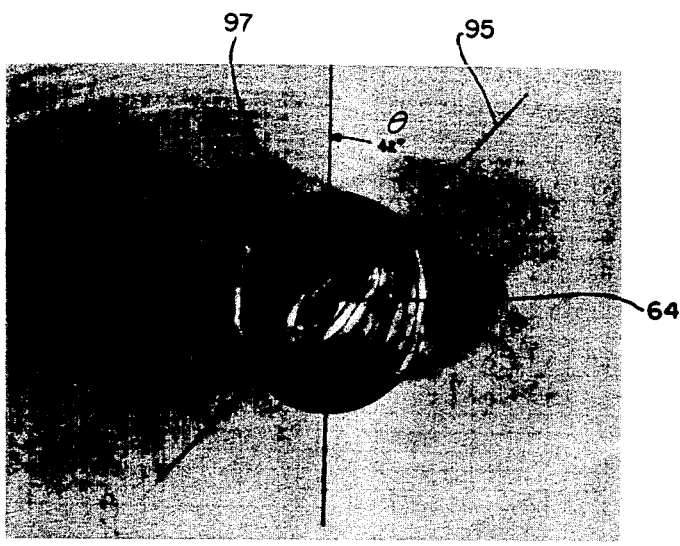
FIG. 2(b) is an actual size photograph of an R plane alpha alumina single crystal produced in accordance with conventional techniques showing the elliptical cross-section of the crystal and the last formed portion of the crystal.

By controlling the rotational speed of seed rod 2, and hence the crystal grown thereon, as hereinbelow more particularly described, the resulting unicrystalline R-plane alpha alumina material has a substantially circular cross-section as illustrated in the photograph of FIG. 2(a) which shows a crystal of R-plane alpha alumina produced using a seed rod rotation speed of 10 rpm in accordance with the present invention. This can be compared to the elliptical cross-section obtained in the crystal of R-plane alpha alumina material shown in FIG. 2(b) which was produced in essentially the same manner as the crystal of FIG. 2(a) except that a rotation speed of 5 rpm was used. The photographs of FIGS. 2(a) and 2(b) show the lowermost or last formed portions of the grown boules and these portions have been marked on their surfaces with equispaced contour lines which lie in planes perpendicular to the longitudinal axes of the boules. These contour lines, which effectively represent the transverse cross-section of the boules, are hereinafter more fully discussed.

With reference to FIG. 3, a massive R-plane alpha alumina single crystal 60 is shown in the course of its production by being pulled from alpha alumina melt 9' contained in crucible 8'. The interface of single crystal 60 with melt 9' is shown at 62, and upon withdrawing single crystal 60 completely from the melt 9', the resulting material, or boule, has a characteristic, generally conical lower portion as shown at 63 in FIG. 3(a). The lower-most part of the lower portion of the boule, boule, schematically indicated at 64 or 64' in FIGS. 3, 3(a) through 3(d) and FIGS. 2(a) and 2(b) (hereinafter more particularly discussed) is in the form of a facet of elongate cross section. In the production of R-plane water-white alpha alumina crystals, it has been found that, invariably, the cross-section of the crystal is not uniformly circular, but is generally elliptical as shown in FIGS. 3(b) and 3(c). It has also been found that the largest diameter 66 of the elliptical cross-section lines in the plane defined by the C-axis of the crystal and the longitudinal axis of the crystal. This plane is indicated at 67 in FIG. 3(b), 3(c) and 3(d) and in the isometric illustration of FIG. 4 which shows a portion of a crystal 60. It has been further found that the major axis 68 of the transverse, elongate cross-section of facet 64 occurs, with reference to FIG. 3(b), at an angle, designated 0 in the drawing with plane 67. It is customary to slowly rotate crystal 60 (by rotating the seed rod on which it is grown) during the pulling of the crystal from melt 9' for the purpose of averaging out any radial thermal assymetry in the melting apparatus. It has been found that the rate of rotation of the crystal 60 has an effect on the angle 0: For example, with reference to FIG. 3(b), if the rotational speed of the crystal is increased, the magnitude of angle 0 increases. Also, if the direction of rotation of the crystal 60 is reversed, as indicated in FIG. 3(c), the angle 0 shifts to the position indicated in FIG. 3(c). With increasing rotational speed of the crystal 60, regardless of direction, the angle 0 can be increased until the major axis 68 of elongate face 64 is substantially perpendicular to the plane 67 defined by the C-axis of the crystal and the longitudinal axis of the crystal, as indicated at 64' in FIG. 3(d). It has been found that R-plane single crystals produced at relatively high rotational speed, such that the axis 68 elongate face 64' is substantially perpendicular to the plane 67 defined by the C-axis of the crystal and the longitudinal axis of the crystal, are of constant, substantially circular cross-section as indicated in FIG. 3(d). That is to say, that with increasing rotational speeds, the characteristically longer diameter 66 of R-plane single crystal material becomes shorter and becomes substantially the same as the characteristically smaller diameter 70, resulting in the circular cross-section crystal of FIG. 3(d) and 2(a) wherein diameters 66' and 70' are substantially the same. With increasing rotational speeds, the generally symmetrical shape of face 64, in the elliptical crystals shown in FIGS. 3(b), 3(c) and 2(b) becomes somewhat distorted and eccentric as shown at 64' for the circular crystals of FIGS. 3(d) and 2(a) and also the step-like occurrence of facets indicated at 75 in FIG. 5 and 5(a), which is characteristic of elliptical cross-section crystals, is essentially eliminated in circular cross-section crystals as illustrated in FIG. 6. This is a further advantage of the present invention in that it has been noted that in instances where bubble defects occur in single crystals, indicated at 80 in FIG. 5(a), these bubbles appear to have been generated in relation to the sites of the step-like facets 75. Consequently, the elimination of the step-like facets 75 in the substantially circular cross-section crystals of FIG. 6 reduces likelihood of bubble defects. In the practice of the present invention, the appropriate rotational speed of the crystal depends on the size of the crystals to be grown i.e. the diameter of the crystal, and to some extent on the particular apparatus used. Generally, for larger diameter crystals, using the same melting apparatus, generally slower rotational speeds are required.

To determine the appropriate rotational speed to produce circular cross-section crystals of a given diameter crystal to be produced in a particular apparatus, a pilot run is performed at a first relatively low rotational speed, e.g. 3–5 rpm and the angle for this crystal observed. The speed for successive pilot crystals is increased until the angle 0 is such that the longitudinal axis 68 of the facet 64' is substantially perpendicular to the plane defined by the C-axis of the crystal and the longitudinal axis of the crystal, as illustrated in FIG. 3(d) and FIG. 2(a). The rotational speed for this condition will be the appropriate value for the production of crystals of the particular crystal diameter with the apparatus being used.

The axis of the elongate facet for any crystal 60 can be conveniently determined by the technique illustrated in the photograph of FIG. 2(b). The surface of the end portion of the crystal of FIG. 2(b) has been marked with contour lines as previously described. A line 95, drawn as indicated, as the major axis of ellipsoid 97, corresponds to the major axis of the elongate facet of interest designated 64 in FIGS. 3(b) and 3(c). The angle 0 for the elliptical cross-section crystal of FIG. 5 is 42°. FIG 2(a) shows the same type of construction for a circular cross-section crystal in which 0 is 90°. The crystal of FIG. 2(a) was produced in accordance with the present invention using a higher rotation speed.

The following examples will further illustrate the present invention:

EXAMPLE I

About 7000 grams of cleaned chunks of alumina crackle (sapphire) were placed in an iridium crucible having an inside diameter of 5 inches, a wall thickness of 0.1 inch and a height of 10 inches. The crucible was placed within a 10 turn induction heating coil having an I.D. of 9.5 inches. The crucible stood on a pedestal containing packed zirconia powder while the space between the coil and the crucible was also packed with zirconia powder. This entire apparatus was enclosed in an aluminum bell jar having an aperture at its top. A nitrogen atmosphere containing about 600 ppm oxygen was maintained inside the bell jar. The induction heating coil was energized from a well known R.F. induction heating unit and the power was increased until the induced current in the iridium crucible heated it to a ⸺white heat." Conductive heat from the iridium crucible then melted the alumina chunks to form a melt. A unicrystalline R-plane alpha alumina seed rod inch diameter was lowered through the aperture in the bell jar until it contacted the surface of the melt. The seed was then withdrawn from the melt at about 0.1 inch per hour for 124 hours while being rotated at 10 RPM. A final substantially circular cross-section elongated boule having diameter measurements of 2.475 inch (longest diameter) × 2.340 inch (shortest diameter) at a length of about 11.5 inches was obtained. This boule was massive, water-white, non-granular unicrystalline alpha alumina of substantially circular cross-section. The major axis of the elongate cross-section facet at the tip of the boule was substantially perpendicular to the plane defined by the C-axis of the crystal and the longitudinal axis of the crystal, i.e. the angle 0 for the boule was 90° ± 15°.

EXAMPLES II

About 5000 grams of cleaned chunks of alumina crackle (sapphire) were placed in an iridium crucible having an inside diameter of 5 inches, a wall thickness of 0.1 inch and a height of 10 inches. The crucible was placed within a 10 turn induction heating coil having an I.D. of 9.5 inches. The crucible stood on a pedestal containing packed zirconia powder while the space between the coil and the crucible was also packed with zirconia powder. This entire apparatus was enclosed in an aluminum bell jar having an aperture at its top. A nitrogen atmosphere containing about 600 ppm oxygen was maintained inside the bell jar. The induction heating coil was energized from a well known R.F. induction heating unit and the power was increased until the induced current in the iridium crucible heated it to a white heat. Conductive heat from the iridium crucible then melted the alumina chunks to form a melt. A unicrystalline R-plane alpha alumina seed rod 0.3 inch diameter was lowered through the aperture in the bell jar until it contacted the surface of the melt. The seed was then withdrawn from the melt at about 0.1 inch per hour for 125 hours while being rotated at 10 RPM. A final substantially circular cross-section elongated boule having diameter measurements of 2.425 inch (longest diameter) × 2.295 inch (shortest diameter) at a length of about 10 inches was obtained. This boule was massive, water-white, non-granular unicrystalline alpha alumina of substantially circular cross-section. The major axis of this elongate cross-section facet at the tip of the boule was substantially perpendicular to the plane defined by the C-axis of the crystal and the longitudinal axis of the crystal, i.e. the angle $\theta$ for the boule was 90° 35 15°.

EXAMPLE III

About 7000 grams of cleaned chunks of alumina crackel (sapphire) were placed in an iridiumcrucible having an inside diameter of 5 inches, a wall thickness of 0.1 inch and a height of 10 inches. The crucible was placed within a ten turn induction heating coil having an I.D. of 9.5 inches. THe crucible stood on a pedestal containing packed zirconia powder while the space between the coil and the crucible was also packed with zirconia powder. This entire apparatus was enclosed in an aluminum bell jar having an aperture at its top. A nitrogen atmosphere containing about 600 ppm oxygen was maintained inside the bell jar. The induction heating coil was energized from a well known R.F. induction heating unit and the power was increased until the induced current in the iridium crucible heated it to a white heat. Conductive heat from the iridium crucible then melted the alumina chunks to form a melt. A unicrystalline R-plane alpha alumina seed rod 0.3 inch diameter was lowered through the aperture in the bell jar until it contacted the surface of the melt. The seed was then withdrawn from the melt at about 0.1 inch per hour for 130 hours while being rotated at 5 RPM. A final substantially elongated boule off elliptical cross-section having diameter measurements of 2.545 inch (longest diameter) × 2.145 inch (shortest diameter) and length of about 11 inches was obtained. This boule was massive, water-white, non granular crystalline alpha alumina. The major axis of the elongate cross-section facet at the tip of the boule was at an angle of about 45° with the plane defined by the C-axis of the crystal and the longitudinal axis of the crystal, i.e. the angle $\theta$ for the boule was 45° ±5°.

EXAMPLE IV

About 7000 grams of cleaned chunks of alumina crackele (sapphire) were placed in an iridium crucible having an inside diameter of 5 inches, a wall thickness of 0.1 inch and a height of 10 inches. The crucible was placed within a ten turn induction heating coil having an I.D. of 9.5 inches. The crucible stood on a pedestal containing packed zirconia powder while the space between the coil and the crucible was also packed with zirconia powder. This entire apparatus was enclosed in an aluminum bell jar having an aperture at its top. A nitrogen atmosphere containing about 600 ppm oxygen was maintained inside the bell jar. The induction heating coil was energized from a well known R.F. induction heating unit and the power was increased until the induced current in the iridium crucible heated it to a white heat. Conductive heat from the iridium curcible then melted the alumina chunks to form a melt. A unicrystalline R-plane alpha alumina seed rod 0.3 inch diameter was lowered through the aperture in the bell jar until it contacted the surface of the melt. The seed was then withdrawn from the melt at about 0.090 inch per hour for 149 hours while being rotated at 5 RPM. A final substantially elongated boule off elliptical cross-section having diameter measurements of 2.455 inch (longest diameter)× 2.165 inch (shortest diameter) and length of about 11.5 inches was obtained boule was massive, water-white, non-granular unicrystalline alpha alumina. The major axis of the elongate cross-section facet at the tip of the boule was at an angle of about 45° with the plane defined by the C-axis of the crystal and the longitudinal axis of the crystal, i.e. the angle $\theta$ for the boule was 45° ± 15°.

FIG. 7 shows a graph wherein for examples I–IV, the ratio of the smallest diameter to the largest diameter is plotted against the length of the crystal, the length being measured from the "shoulder" of the particular crystal, indicated by way of illustration at 90 in FIG. 3(a).

As can be seen from the graph of FIG. 7, for crystal length up to about 6 inches, the cross-sections of the crystals of all examples can be considered to be substantially circular (minimum diameter; maximum diameter 0.9 or higher). However, at crystal lengths from about 6 inches and longer, the crystals of Examples III and IV (5 rpm rotation rate) become elliptical whereas the crystals of Examples I and II, (10 rpm rotation rate) in accordance with the present invention ($\theta$ of substantially 90°) maintain b constant substantially circular cross-section up to the 6 inch length, and at all greater lengths.

What is claimed is:

1. In a process for the production of massive unicrystalline alpha alumina by
   i. forming a melt of alumina by heating the same to form a melt at a temperature of at least 2040° C,
   ii. inserting a seed rod of alpha alumina into the melt,
   iii. maintaining an atmosphere over the melt which is substantially chemically inert to the melt,
   iv. withdrawing the seed rod from the melt such that alumina material is solidified and crystallized on the seed rod to form a massive unicrystalline product of increasing length having a growth axis common with the longitudinal axis of the seed rod, the improvement for producing massive unicrystalline R-plane alpha alumina of substantially circular cross-section which comprises
      a. employing as the seed rod unicrystalline alpha alumina having an orientation such that its longitudinal axis is 57½° from the C-axis of the seed crystal and is normal to an R-plane of said seed rod and
      b. rotating said seed rod about its longitudinal axis at a rotation rate such that the solidified and crystallized alumina material upon withdrawal from the melt has an elongated end portion facet, the major axis of which, lying in a plane perpendicular to the longitudinal axis of the solidified and crystallized material, is substantially perpendicular to the plane defined by the C-axis and the longitudinal axis of the solidified and crystallized material.

* * * * *